United States Patent [19]

Schreck

[11] Patent Number: 5,365,486

[45] Date of Patent: Nov. 15, 1994

[54] METHOD AND CIRCUITRY FOR REFRESHING A FLASH ELECTRICALLY ERASABLE, PROGRAMMABLE READ ONLY MEMORY

[75] Inventor: John F. Schreck, Houston, Tex.

[73] Assignee: Texas Instruments Incorporated, Dallas, Tex.

[21] Appl. No.: 991,233

[22] Filed: Dec. 16, 1992

[51] Int. Cl.$^5$ .............................................. G11C 7/00
[52] U.S. Cl. .................................. 365/222; 365/185; 365/900
[58] Field of Search ................ 365/222, 900, 185, 218

[56] References Cited

U.S. PATENT DOCUMENTS

| | | | |
|---|---|---|---|
| 5,031,147 | 7/1991 | Maruyama et al. | 365/222 X |
| 5,200,920 | 4/1993 | Norman et al. | 365/185 |
| 5,237,535 | 8/1993 | Mielke et al. | 365/900 X |
| 5,239,505 | 8/1993 | Fazio et al. | 365/185 |

Primary Examiner—Eugene R. LaRoche
Assistant Examiner—Christopher R. Glembocki
Attorney, Agent, or Firm—Dennis W. Braswell; Leo N. Heiting; Richard L. Donaldson

[57] ABSTRACT

A method and apparatus for flash EEPROM refresh is provided in which the control gate of a particular memory cell is read at an elevated control gate voltage (42). It is next determined whether the cell has been programmed (44). If the cell has been programmed, then the next memory cell is read (46). If it is initially determined that the cell has not been programmed (44), then the particular memory cell is read at a lowered control gate voltage (48). It is then finally determined whether the cell has been programmed (50). If it is determined that the cell has not been programmed, then the next cell is read (46). If it is determined that the cell has been programmed (50), then the memory is refreshed (52). After refresh, the next memory cell is read (46).

46 Claims, 4 Drawing Sheets

METHOD AND CIRCUITRY FOR REFRESHING A FLASH ELECTRICALLY ERASABLE, PROGRAMMABLE READ ONLY MEMORY

TECHNICAL FIELD OF THE INVENTION

This invention relates generally to electrically-erasable, programmable read-only memories (EEPROMs), and more particularly to a method and apparatus for flash EEPROM refresh.

BACKGROUND OF THE INVENTION

Electrically-erasable, programmable read-only memories (EEPROMs) employing single transistor memory cells (also referred to as bits), and which use hot carrier injection for programming and Fowler-Nordheim tunneling for erasure are in wide usage, and have been described, for example, in "A Single Transistor EEPROM Bit and its Implementation in a 512K CMOS EEPROM(s)," Mukheree, et al., IEDM 1985, pp. 616–619, and "A 90 NS 100K Erase/Program Cycle Megabit Flash Memory," V. Kynett, et al., ISSCC 1989, pp. 140–141.

Such EEPROMs are programmed via hot-electron injection to a floating gate by the application of high voltage to the control gate and drain of a particular memory bit while keeping the source of that memory bit grounded. For example, the drain programming voltage, $V_{dp}$ is kept below 6.5 volts while the control gate programming voltage, $V_{cgp}$ is held at 12 volts. Erasing is accomplished by maintaining the control gate voltage at $V_{cge}=0$ volts, floating the drain, and raising the source to $V_{se}=12$ volts. Erased cells conduct, and programmed cells do not conduct, with their control gates raised to a read voltage of approximately 5 volts. The above-described examples are for explanation only, it being understood that other voltages may be used to accomplish the same effect.

A particular type of EEPROM, known as a flash EEPROM, divides memory bits into various sectors. Within each sector, the source of each memory bit transistor is tied to a common node. Thus, erasure can be performed only on a sector-by-sector basis, or on different sectors in parallel. The control gates of the memory bit transistors are coupled to wordlines, and their drains to bitlines.

When sectors are physically separated on an integrated circuit, erasure of a particular sector has little effect on other sectors. However, physical separation of sectors requires an area penalty, and thus in applications where memory density is important, physical separation is unattractive.

Without physical separation, memory cells within different sectors may share the same bitlines, and thus, voltages placed on these bitlines produce electrical field effects on all sectors sharing these bitlines. Furthermore, memory cells within different sectors may share wordlines, and voltages on these shared wordlines create field effects in all sectors sharing them.

The electric fields generated on the shared bitlines and wordlines may have the effect of erasing programmed bits or programming erased bits. For example, raising the voltage on a wordline to program an erased bit may disturb a previously programmed bit on the same wordline by removing some electrons from the floating gate to the control gate of the previously programmed bit. This type of disturbance is known as wordline stress.

Another type of wordline stress, known as wordline stress up or wordline softwrite, occurs when an otherwise erased bit has its wordline raised to a high voltage due to programming of another bit on the same wordline. This disturb condition results in the addition of electrons to the floating gate of the erased bit by tunneling of electrons from the channel.

With shared bitlines, a disturbance known as bitline stress often occurs. Bitline stress occurs when a previously programmed bit has its drain raised to a high voltage as a result of programming another bit on the same bitline. This disturbed condition results in the removal of electrons from the floating gate of the previously programmed bit through diffusion.

EEPROMS can typically withstand a large number, such as 10,000, erase cycles before their performance deteriorates to the point that they cannot meet their rated specifications. Consequently, the amount of time that a particular bit in a sectored chip experiences a disturb condition, such as bitline or wordline stress, may become very large in flash EEPROMS. For example, a programmed bit in a given sector may experience 10,000 periods of bitline stress if it remains in a single program state while bits in other sectors which share the same bitline are repeatedly programmed and erased. The longer that bits experience disturb conditions, the more likely it is that they will lose data, either by converting from an erased state to a programmed state, or from a programmed state to an erased state. Such data loss or gain is unacceptable.

Therefore, a need has arisen for a method and apparatus for refreshing EEPROM bits to prevent data loss.

SUMMARY OF THE INVENTION

In accordance with the present invention, a method and apparatus for refreshing flash EEPROMs is provided which substantially eliminates disadvantages and problems associated with prior art flash EEPROMs.

In particular, a method and apparatus is provided for refreshing a flash EEPROM having a plurality of memory cells, in which a particular memory cell is read at an elevated control gate voltage. From this read operation, it is initially determined whether the particular memory cell has been programmed. If the initial determination is that the particular memory cell has been programmed, then another memory cell is processed. If the initial determination is that the particular memory cell has not been programmed, then the memory cell is read at a lowered control gate voltage. After this read operation, a final determination of whether the particular memory cell has been programmed is made. If the final determination is that the particular memory cell has not been programmed, then another memory cell is processed. If the final determination is that the particular memory cell has been programmed, then that particular memory cell is refreshed, and another memory cell is processed. Refresh is accompanied by pulsing the disturbed bit with a restoration pulse. The order in which the memory cells are read at the elevated and lowered control gate voltage may also be reversed.

In another embodiment, both programmed and erased memory cells can be refreshed. With this embodiment, a memory, such as a random access memory, stores the state of each memory cell, as determined by a read of the cell. This memory is accessed to obtain information on the state of a particular cell being tested.

If the state of the particular memory cell is erased, then the particular memory cell is read at a lowered control gate voltage, and it is determined whether the particular memory cell is still erased. If the memory cell is still erased, then another memory cell is tested. If the particular memory cell has been disturbed, then the sector in which that memory cell resides is erased, and the sector is then reprogrammed. After testing the erased bits, the programmed bits are tested if there has been no erasure and reprogramming. Each of the programmed memory cells are read at an elevated control gate voltage to determine whether they are still programmed. If it is determined that a particular memory cell is still programmed, then another programmed memory cell is processed. If the determination is made that the particular memory cell has been disturbed, then the memory cell is refreshed, and another memory cell is processed.

An important technical advantage of the present invention is the fact that it provides a method and apparatus for refreshing flash EEPROMs, thereby preventing data loss caused by bitline and wordline stresses in flash EEPROMs.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1-6 of the drawings, like numerals being used for like and corresponding parts of the various drawings.

Figure 1:
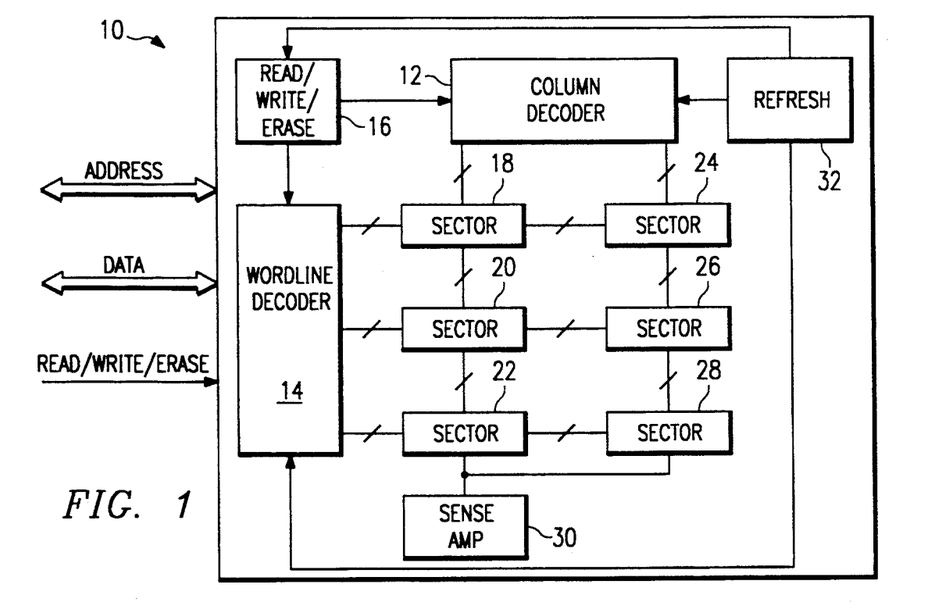
FIG. 1 is a block diagram of a flash EEPROM with refresh capabilities according to the teachings of the present invention.

FIG. 1 is a block diagram of a flash EEPROM 10 with refresh capability according to the teachings of the present invention. As shown in FIG. 1, flash EEPROM 10 provides address and data links for external communications. Furthermore, it may be enabled for reading, programing (writing), or erasure. Included within flash EEPROM 10 are column decoder 12 and wordline decoder 14. Furthermore, read/write/erase circuitry 16 is coupled to both column decoder 12 and wordline decoder 14. Particular memory cells are read, programmed, or erased by signals from column decoder 12 and wordline decoder 14.

Memory bits (or cells) within flash EEPROM 10 are grouped in various sectors. As shown in FIG. 1, these sectors are sector 18, sector 20, sector 22, sector 24, sector 26, and sector 28. It should be understood that flash EEPROM 10 as shown in FIG. 1 is for purposes of teaching the present invention, and other sector arrangements may be used with the present invention without departing from the intended scope herein.

Sectors 18, 20 and 22 share common bitlines from column decoder 12. Likewise, sectors 24, 26 and 28 share common bitlines from column decoder 12. Sectors 18 and 24 share common wordlines from wordline decoder 14. Sector 20 and sector 26 also share common wordlines from wordline decoder 14. Likewise, sectors 22 and 28 share common wordlines from wordline decoder 14. All of the bit lines from column decoder 12 are coupled to sense amp 30, which is used to sense the data on various bits and transmit that data for external communications.

Refresh circuitry 32 is coupled to column decoder 12, wordline decoder 14, and read/write/erase circuitry 16. Refresh circuitry 32 ensures that disturb conditions, as described in the background of the invention, do not result in altered data.

As described in the background of the invention, erasures within flash EEPROMs are on a sectorwide basis. For example, bits in sector 18 may be erased by erasing all of the bits within sector 18. This ability to erase on a sectorwide basis, however, can result in significant disturb conditions to bits in other sectors not being erased.

As an example of a worst case condition, a programmed bit within sector 22 can experience significant stress time. With specifications for flash EEPROM 10 that allow for $10^5$ erasure cycles for each sector, then a programmed bit within sector 22 could experience on the order of 200 seconds of stress time. This 200 second period is arrived at with the following assumptions. Assuming a programming time of ten microseconds, and 1024 wordlines for each sector, approximately twenty milliseconds of bit line stress time could be experienced by a programmed bit within sector 22 as a result of the programming of every bit on that bitline within sectors 18 and 20. Furthermore, sectors 18 and 20 may each be cycled 100,000 times, resulting in 100,000×20 milliseconds, or 2000 seconds of stress time on a particular programmed bit within sector 22. An another example, with each wordline being a sector, and 1024 wordlines, one programmed bit may experience $(1024-1) \times 10$ microseconds $\times \times 10^5 \approx 1020$ seconds of stress time.

Figure 2:
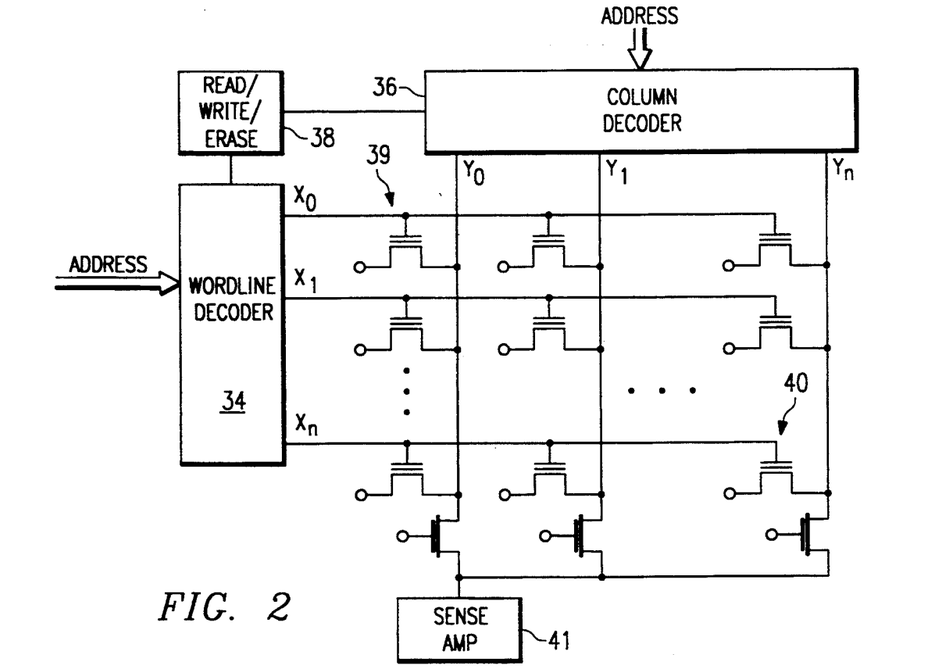
FIG. 2 is a simplified schematic of an array of EEPROM memory cells.

FIG. 2 is a simplified schematic of a typical array of EEPROM memory cells. As shown in FIG. 2, an array of memory cells are coupled to wordline decoder 34 and column decoder 36. Read/write/erase circuit 38 is coupled between column decoder 36 and wordline decoder 34. Wordline decoder 34 has associated with it n wordlines, designated $x_0, x_1, \ldots x_n$. Likewise, column decoder 36 has associated with it n bitlines, $y_0, y_1, \ldots y_n$. Each memory cell is coupled to one wordline and one bitline. For example, memory cell (or bit) 39 has its control gate coupled to wordline $x_0$ and its drain coupled to bitline $y_0$. Similarly, memory cell 40 has its control gate coupled to wordline $x_n$ and its drain coupled to bitline $y_n$. The sources of all of the memory cells within a particular sector are commonly coupled. Particular bits are read by a sense amp 41 through pass gate transistors on each bitline. Examples of typical voltages for various operations are as follows:

TABLE I

|  | Read | Write | Flash Erase |
| --- | --- | --- | --- |
| Selected Wordline | 5 V | 12 V | −15 V/0 V (All) |
| Deselected Wordlines | 0 V | 0 V | — |
| Selected Drain Line | 1.0 V | 5–10 V | Float (All) |
| Deselected Drain Lines | 0 V/Float | 0 V/Float | — |
| Source Lines | 0 V | About 0 V | 0 V/12 V (All) |

As shown in TABLE I, two erase voltages are shown. The first corresponds to negative voltage wordline erasing, and the second to positive voltage wordline erasing.

Figure 3A:
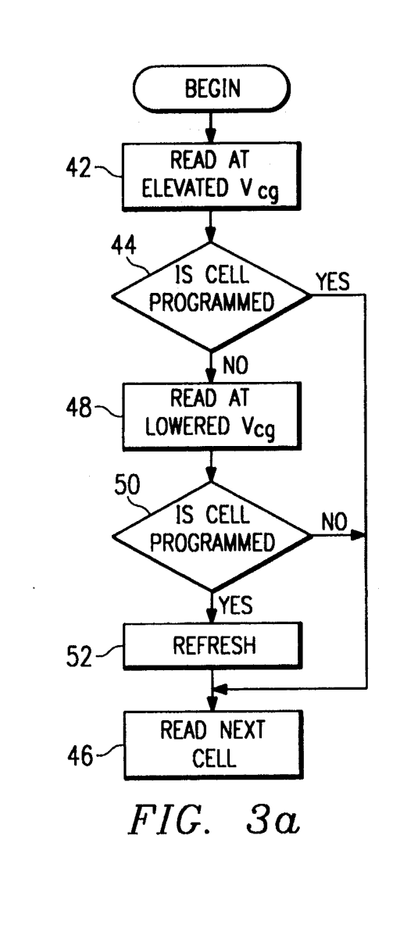
FIGS. 3a and 3b are flow diagrams of methods of refreshing according to the teachings of the present invention.

FIG. 3a is a flow diagram of a method of refreshing programmed bits according to the teachings of the present invention. As shown in FIG. 3a, block 42 is first encountered at which a particular cell is read at an elevated control gate voltage, $V_{cg}$, to determine if it has been programmed. For example, this elevated control gate voltage may be 7.0 volts. Since programmed cells should not conduct, placing an elevated voltage on the control gate of a particular cell will result in conduction unless that cell is programmed, and its floating gate has enough charge on it to prevent conduction. If a programmed cell has been disturbed, and some its charge is gone, for example, through wordline stress or bitline stress, then the use of the elevated voltage at the control gate will result in current flow. Therefore, at decision block 44, an initial determination is made whether the cell is programmed. If no conduction occurs through the cell at the elevated control gate voltage applied at block 42, then the cell has been programmed and has not been disturbed, and the next cell is to be read at block 46. By "no conduction," it is meant that little enough conduction occurs such that the bit is interpreted as programmed. When it is stated that there is conduction, it is generally meant that there is enough conduction through a bit for it to be interpreted as erased.

If, however, it is determined at block 44 that conduction has occurred after application of the elevated control gate voltage at block 42, then block 48 is encountered. At block 48, the particular bit is read at a lowered control gate voltage, such as 5.0 volts. This lowered control gate voltage should be high enough to ensure conduction if the bit is an erased bit, and not so low as to result in no condition for an erased bit that has been disturbed through a soft write.

At decision block 50 it is then determined whether the cell is a programmed cell. If there is conduction at this lowered control gate voltage, then the cell is an erased cell and no refresh is necessary, and the next cell is read at block 46. If, however, no conduction occurs after the lowered control gate voltage has been applied to the particular bit, then it is determined that the bit had been programmed, but has been disturbed. This information results since conduction occurred at the elevated control gate voltage, but did not occur at the lowered control voltage, indicating that some of the charge has left the floating gate. Therefore, block 52 is encountered and the particular memory cell is refreshed. As an alternative, the byte in which the particular memory cell resides could also be refreshed, rather than just the particular disturbed bit.

Refresh by block 52 may be performed by transmitting an additional program pulse to the corrupted program bit. This additional program pulse restores that bit's programming margin. This restoration pulse should be of a different pulse width than the original programming pulse, to prevent the bit from programming to too high a level. For example, a restoration pulse of three microseconds may be used where an original programming pulse of ten microseconds has been used. After this refresh operation of block 52 is performed, the next cell is read and the same process performed.

Figure 3B:
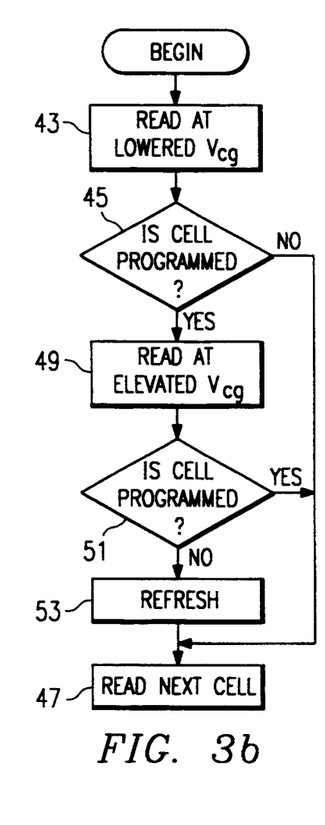

FIG. 3b illustrates an alternative method for refreshing programmed bits according to the present invention. The method of FIG. 3b is similar to that of 3a, except that each cell is first read at the lowered control gate voltage and then read at the elevated control gate voltage if necessary. The lowered control gate read is performed at block 43. If at decision block 45 it is then initially determined that the cell was not programmed, because of conduction, then the next cell is read at block 47. If at block 45 it is determined that the cell has been programmed, then the cell is read at the elevated control gate voltage at block 49. If at decision block 51 it is determined that the cell is still programmed, then block 47 is encountered. If at decision block 51 it is determined that the cell has been disturbed, because of conduction of block 49, then refresh is performed at block 53.

Figure 4:
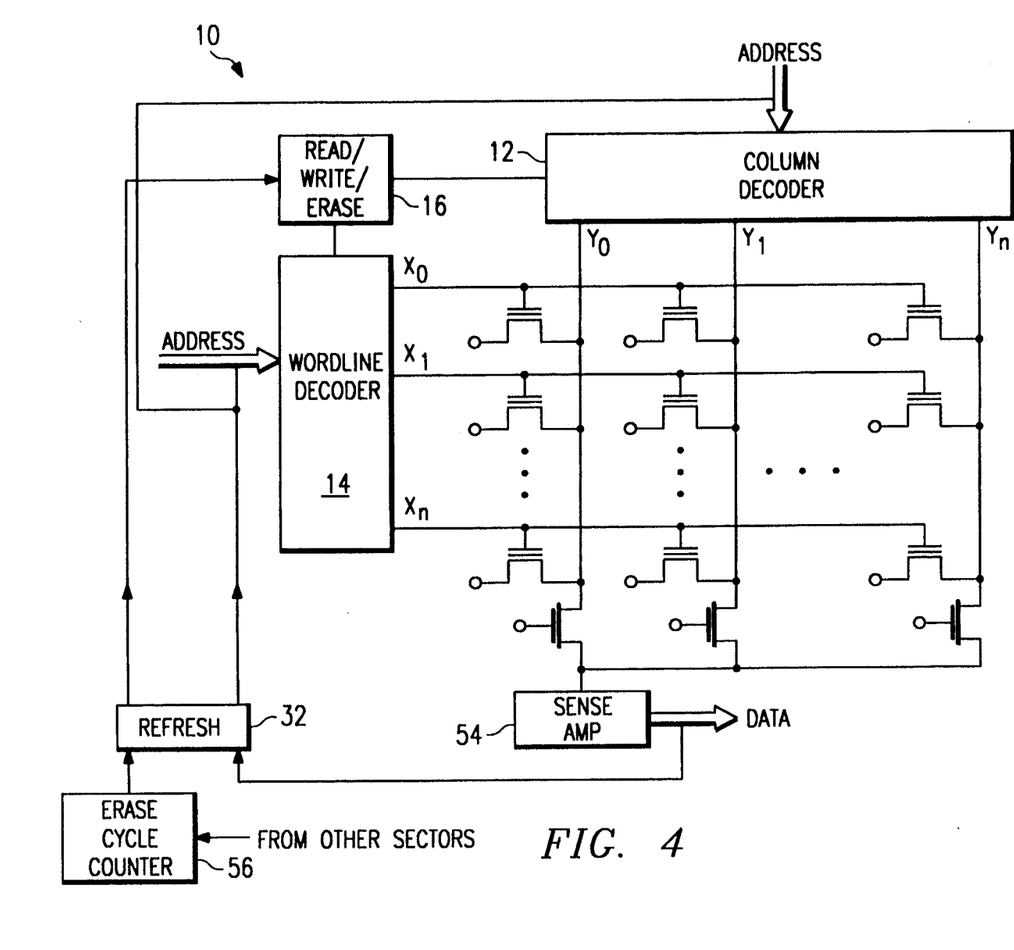
FIG. 4 is a simplified schematic and block diagram of a particular embodiment of circuitry for EEPROM refresh according to teachings of the present invention.

FIG. 4 illustrates a schematic and block diagram of circuitry for performing refresh according to the teachings of the present invention. To the extent provided in both FIGS. 1 and 4, the reference numbers correspond. As shown in FIG. 4, an array of memory cells is coupled between column decoder 12 and wordline decoder 14. Furthermore, read/write/erase circuit 16 is coupled between column decoder 12 and wordline decoder 14. Furthermore, refresh circuitry 32 is coupled to column decoder 12, wordline decoder 14 and read/write/erase circuit 16. Refresh circuit 32 is also coupled to the data output from sense amp 54. An erase cycle counter 56 is also coupled to refresh circuit 32 and receives an input from other sectors.

FIG. 4 illustrates an array of memory cells in a particular sector, it being understood that other sectors share the same bitlines and/or wordlines shown in FIG. 4. In operation, refresh circuit 32 performs the method shown in the flow diagram of FIG. 3. Thus, refresh circuit 32 causes each of the memory cells to be read at the appropriate elevated or lowered control gate voltages, and controls read/write/erase circuit 16, column decoder 12 and wordline decoder 14 to refresh any cells as required.

The frequency with which refresh circuit 32 reads each array of memory cells is determined by erase cycle counter 56. Erase cycle counter 56 counts the number of erase cycles performed in sectors electrically associated with the sector shown in FIG. 4. That is, erase cycle counter 56 counts the number of erase cycles that could cause disturb conditions in the sector shown in FIG. 4. Erase cycle counter 56 can be set according to the particular needs of the system in which flash EEPROM 10 is included. As an example, erase cycle counter 56 may be set at ten, such that refresh occurs after any ten erase cycles from any of the sectors that could cause disturb conditions within the sector shown in FIG. 4. An another example, erase cycle counter 56 could be set at one.

Referring to FIG. 1, as an example, a refresh for sector 18 would be performed, with erase cycle counter 56 set at ten, once a total of ten erase cycles has been performed in sectors 20, 22 and 24. For example, if two erase cycles were performed in sector 20, five in sector 22, and three in sector 24, a refresh cycle would be performed in sector 18.

Refresh circuit 32 controls column decoder 12 and wordline decoder 14 for refresh of each sector within the flash EEPROM 10. Furthermore, erase cycle counter 56 counts erase cycles in each sector, such that refresh circuit 32 refreshes the appropriate sectors as needed. It should be understood that erase cycle counter 56 is included in a particular embodiment, and other circuits could be used to trigger refresh without departing from the intended scope herein. It should also be understood that refresh may be made on a sector-by-sector basis, or part of or the whole flash EEPROM chip may be refreshed at one time.

Figure 5A:
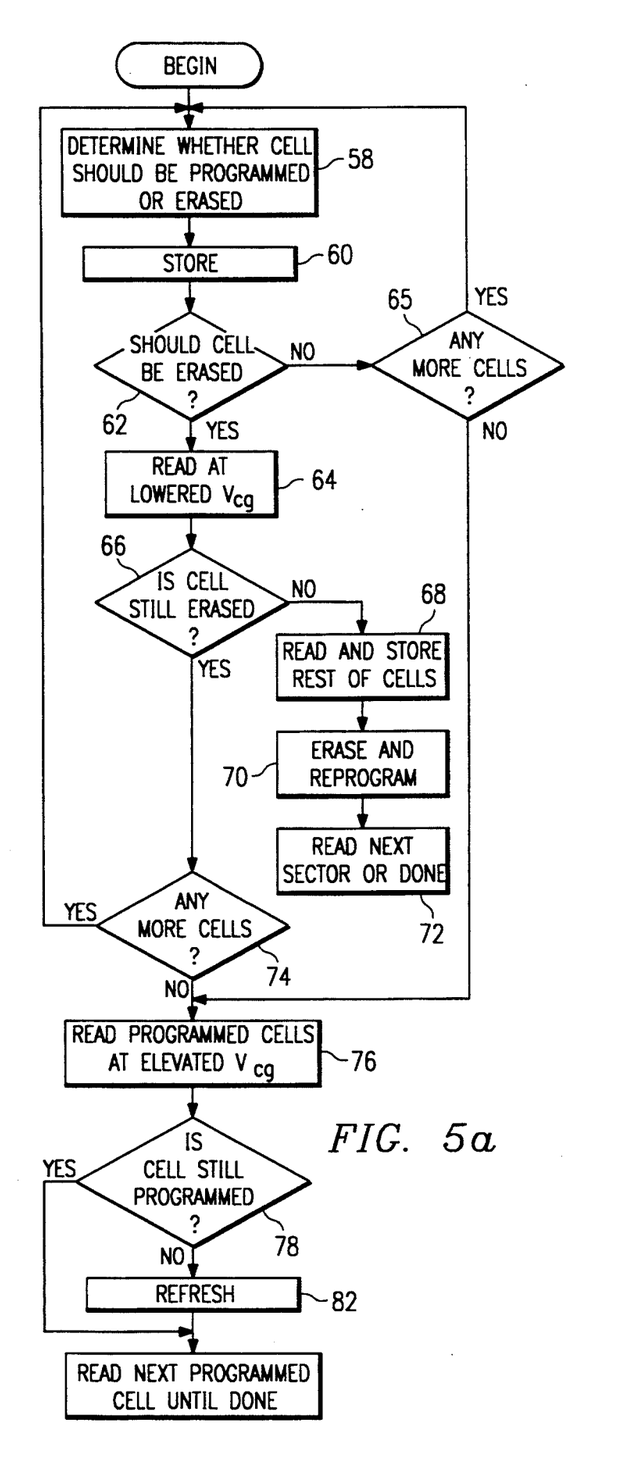
FIGS. 5a and 5b are flow diagrams of other embodiments of methods of EEPROM refresh according to the teachings of the present invention.

FIG. 5a illustrates a flow diagram of another embodiment of a refresh method according to the teachings of the present invention. The method shown in FIG. 5a operates in conjunction with a memory record of the data stored within flash EEPROM 10. This memory record may be stored in a device such as a random access memory or another sector of the same EEPROM being refreshed. As shown in FIG. 5a, block 58 is first encountered wherein it is determined whether the cell being tested should be a programmed or an erased cell. This determination is made by reading the particular cell at a control gate voltage that is just high enough to ensure conduction for all erased cells, even those that have been disturbed, but that is low enough to ensure there is no conduction in programmed cells, even those that have been disturbed. After this read, block 60 is encountered, wherein the state of the particular cell that has been read is stored. This store may be to a random access memory that is off-chip or that has been fabricated on the same chip as the EEPROM array. As another alternative, the data may be stored in another EEPROM sector of the same chip as the array being refreshed. The states of the memory cells are stored so that if an erased cell has been disturbed, the sector in which that cell resides can be refreshed by erasing and reprogramming the sector, based on the stored data. Storage of data can take place at various points in time. For example, storage can be performed as each cell is first read, or storage of all cells can be made initially before reading each cell. As another alternative, the states of all cells can be stored when it is determined that an erased cell has been disturbed.

Next, decision block 62 is encountered. If the cell that has just been read is an erased cell, then block 64 is encountered. If the cell is programmed, then block 65 is encountered after block 62. If there are more cells to read, then block 58 is encountered after block 65. If there are no more, then block 76, to be discussed, is encountered. At block 64, the particular cell is read at a lowered control gate voltage. Block 66 is then encountered where it is determined whether the cell has been disturbed. If the read at block 64 does not show conduction, then the cell has been disturbed and block 68 is encountered. At block 68, the cells of the array being refreshed that have not yet been read are read and stored as described in connection with blocks 58 and 60. As discussed above, storage could also have already been performed, thus obviating the need for block 68. Likewise, at block 68 all cells could be stored, if none had yet been stored. Block 70 is then encountered wherein the whole sector is erased and reprogrammed according to the data stored within the memory described above. Block 70 is included since in flash EEPROMs erasure is on a sector-by-sector basis, and the whole sector must be erased if one cell is to be erased. Furthermore, erasure includes programing of all cells before erasure, to ensure uniform erasure, as is generally known in the art.

Following block 70, block 72 is encountered. Since reprogramming of the whole sector has been accomplished, there is no need to continue the refresh process for the cells within that sector, and either the next sector can be read for refreshing or the method can be stopped until the next refresh cycle is required.

If at block 66 is it determined that the cell is still erased, then decision block 74 is encountered. Decision block 74 determines whether there are any more cells to be read. If there are more cells, then block 58 is encountered and the next cell is read. If there are no more cells to be read, then block 76 is encountered, wherein each of the cells that should be programmed, as determined by block 58 and stored in block 60, are read at an elevated control gate voltage. Decision block 78 then determines whether the particular cell is still programmed. If there is not conduction at the elevated control gate voltage read of block 76, then block 80 is encountered, wherein the next programmed cell is read. If there is conduction at the elevated control gate read of block 76, then block 82 is encountered after block 78. At block 82 the disturbed programmed cell is refreshed. After the cell has been refreshed, block 80 is encountered wherein the next programmed cell is read until all programmed cells have been read for refreshing.

The method described in connection with FIG. 5a determines whether there are any erased bit disturbs first. By performing this function first, refresh time may be shortened since time is wasted by refreshing a disturbed programmed cell which may later be erased and reprogrammed if an erased bit has been disturbed and is later detected within the sector being tested.

Figure 5B:
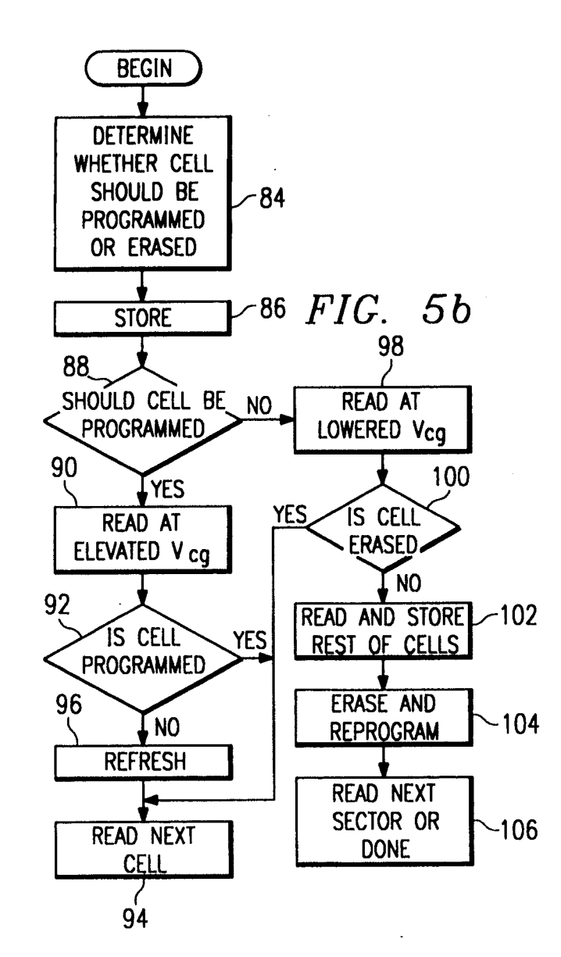

FIG. 5b illustrates an alternative method to that described in connection with FIG. 5a. The flow diagram of FIG. 5b describes a refresh method that also uses a memory record of the data within the sector being tested and allows for correction of both erase disturbs and program disturbs. As shown in FIG. 5b, decision block 84 is first encountered, and it is determined whether a particular memory cell should be a programmed cell or an erased cell, as discussed in connection with block 58 of FIG. 5a. Block 86 is then encountered, wherein the state of the memory cell is stored. As discussed above, storage can take place at other points in time without departing from the present invention. Decision block 88 is then encountered. If the cell is supposed to be a programmed cell, then the cell is read at an elevated control gate voltage at block 90. Next, block 92 is encountered, wherein it is decided whether the cell is indeed still programmed. If no conduction occurs through the cell, then the cell is still programmed, and the next cell is to be read at block 94. If at block 92 is determined that some conduction occurs, then refresh is necessary and is performed at block 96. After refresh of that cell has been performed, the next cell is to be read at block 94.

If at block 88 it is determined that the particular cell is an erased cell, then the cell is read at a lowered control gate voltage at block 98. If at this lowered control gate voltage there is conduction through the cell, then block 100 determines that the cell is still erased, and the next cell is read at block 94. If however, at block 100 it is determined that there is no conduction at the lowered control gate voltage, then a soft write has occurred and it is necessary to erase the cell. Because erasure in flash EEPROMs is performed on a sector-by-sector basis, the whole sector must be erased. Before erasure, block 102 is encountered and then cells which have not yet been read are read and stored as described in connection with blocks 84 and 86. As discussed above, block 102 may not be needed if storage of the whole sector has been performed. Likewise, block 102 may comprise storage of all cells, if none have yet been stored. Next, the whole sector is erased and programmed at block 104 from the information stored in the memory. After reprogramming of that sector, then block 106 is encountered. Since reprogramming of that sector has been accomplished, there is no need to continue the refresh process for the cells within that sector. Thus, either the next sector can be read for refreshing, or the method can be stopped until the next refresh cycle is required.

Figure 6:
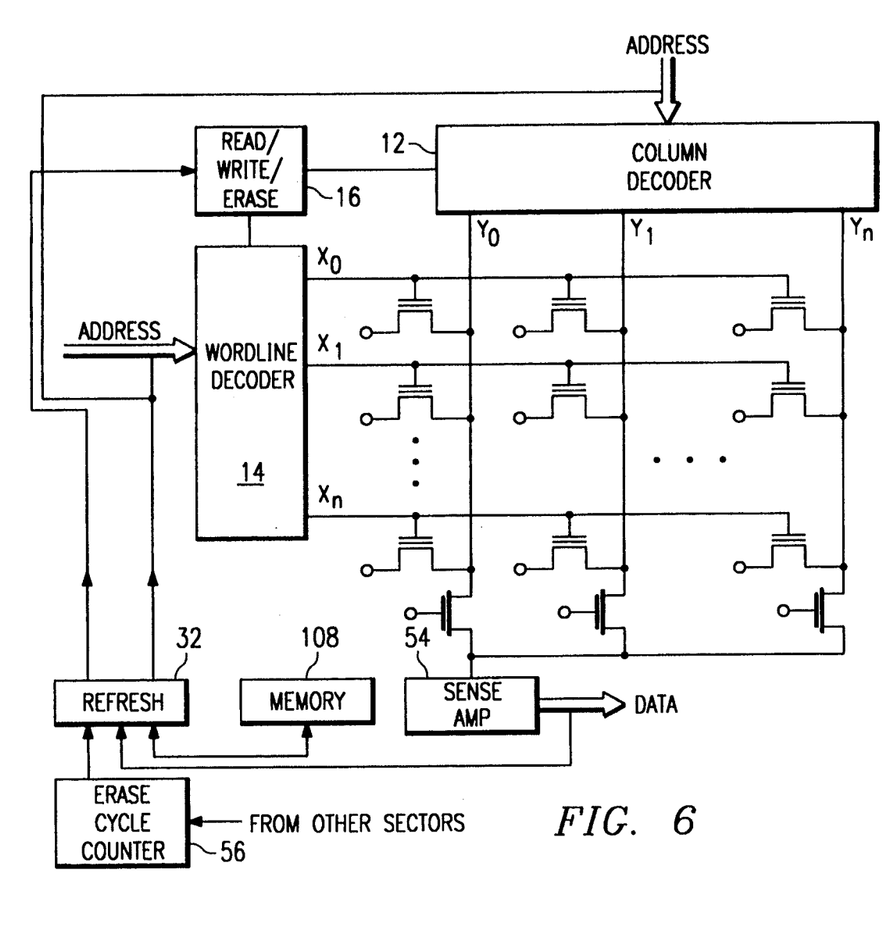
FIG. 6 is a simplified schematic and block diagram of another embodiment of circuitry for EEPROM refresh according to the teachings of the present invention.

FIG. 6 is a simplified schematic and block diagram of a circuit embodiment for the methods shown in FIGS. 5a and 5b. As shown in FIG. 6, the circuitry is similar to that shown in FIG. 4, with the addition of the memory 108. Memory 108 is accessed by refresh circuit 32 for storage of the state of each cell and so as to determine whether a particular cell to be tested should be a programmed or an erased cell. This information, as described in connection with FIGS. 5a and 5b, is used to determine what voltage level should be used to test the particular cell.

The memory 108 may be fabricated on the same chip as the flash EEPROM 10, or may be off chip. Furthermore, it may be a random access memory or it may be another EEPROM sector on the same chip. The on-chip embodiment provides the advantage that the refresh is invisible to the outside system. The advantage to the off-chip embodiment is that the flash EEPROM has a greater memory density.

It should be understood that the present invention may be adapted to a wide variety of flash EEPROMs. For example, with flash EEPROMs that include some sectors that are physically separated and others that are not, refresh would not be required in one sector due to erase cycle in other physically separated sectors. Furthermore, reads may be performed on a byte wide basis to speed up processing, with refresh being required only if an error is detected in one of the bits of a byte. Refresh may then be performed on just the disturbed bits or the entire byte.

The circuit shown in FIG. 6 can be used to reprogram an EEPROM before disturbed conditions arise, thereby eliminating the need to test for disturbed cells. With this embodiment, the states of the memory cells of a given sector are stored and then that sector is erased and reprogrammed. Storage can be initiated after a predetermined number of erase cycles or a predetermined amount of time, for example.

Although the present invention and its advantages have been described in detail, it should be understood that various changes, substitutions and alterations can be made therein without departing from the spirit and scope of the invention as defined by the appended claims.

What is claimed is:

1. A method of refreshing a flash electrically erasable, programmable read only memory having a plurality of memory cells, comprising the steps of:
   reading a particular memory cell at an elevated control gate voltage;
   making an initial determination of whether the particular memory cell has been programmed;
   if the initial determination is that the particular memory cell has been programmed, performing said method on another memory cell;
   if the initial determination is that the particular memory cell has not been programmed, reading the particular memory cell at a lowered control gate voltage;
   making a final determination of whether the particular memory cell has been programmed;
   if the final determination is that the particular memory cell has not been programmed, performing said method on another memory cell;
   if the final determination is that the particular memory cell has been programmed, refreshing the particular memory cell; and
   performing said method on another memory cell.

2. The method of claim 1, wherein said step of making an initial determination comprises determining whether the particular memory cell conducts at the elevated control gate voltage, conduction indicating initially that the particular memory cell has not been programmed.

3. The method of claim 2, wherein said step of making a final determination comprises determining whether the particular memory cell conducts, conduction indicating that the particular memory cell has not been programmed.

4. The method of claim 1, wherein said step of making a final determination comprises determining whether the particular memory cell conducts, conduction indicating that the particular memory cell has not been programmed.

5. The method of claim 1, wherein said step of refreshing comprises pulsing the particular memory cell with a restoration pulse.

6. The method of claim 5, wherein said restoration pulse has a smaller pulse width than the width of a programming pulse.

7. The method of claim 1, wherein the memory cells are divided into sectors, and further comprising the steps of:
   counting the number of erase cycles performed in sectors electrically associated with a particular sector; and
   performing said method on cells within the particular sector in response to said step of counting reaching a predetermined number.

8. A method of refreshing a flash electrically erasable, programmable read only memory having a plurality of memory cells, comprising the steps of:
   reading a particular memory cell at a lowered control gate voltage;
   making an initial determination of whether the particular memory cell has been programmed;
   if the initial determination is that the particular memory cell has not been programmed, performing said method on another memory cell;
   if the initial determination is that the particular memory cell has been programmed, reading the particular memory cell at an elevated control gate voltage;
   making a final determination of whether the particular memory cell is still programmed;
   if the final determination is that the particular memory cell is still programmed, performing said method on another memory cell;

if the final determination is that the particular memory cell has been disturbed, refreshing the particular memory cell; and performing said method on another memory cell.

9. The method of claim 8, wherein said step of making an initial determination comprises determining whether the particular memory cell conducts at the lowered control gate voltage, conduction indicating that the particular memory cell has not been programmed.

10. The method of claim 9, wherein said step of making a final determination comprises determining whether the particular memory cell conducts, conduction indicating that the particular memory cell has been disturbed.

11. The method of claim 8, wherein said step of making a final determination comprises determining whether the particular memory cell conducts, conduction indicating that the particular memory cell has been disturbed.

12. The method of claim 8, wherein said step of refreshing comprises pulsing the particular memory cell with a restoration pulse.

13. The method of claim 12, wherein said restoration pulse has a smaller pulse width than the width of a programming pulse.

14. The method of claim 8, wherein the memory cells are divided into sectors, and further comprising the steps of:

counting the number of erase cycles performed in sectors electrically associated with a particular sector; and performing said method on cells within the particular sector in response to said step of counting reaching a predetermined number.

15. A method of refreshing a flash electrically erasable, programmable read only memory having a plurality of memory cells grouped in sectors of said cells, comprising the steps of:

determining whether a particular memory cell has been programmed or erased;

if the state of a particular memory cell is programmed, performing said method on another memory cell;

if the state of a particular memory cell is erased, performing the steps of:

reading the particular memory cell at a lowered control gate voltage;

making a determination of whether the particular memory cell is still erased;

if the determination is that the particular memory cell is still erased, performing said method on another memory cell;

if the determination is that the particular memory cell has been disturbed, erasing the sector in which the particular memory cell resides; and reprogramming said sector in which the particular memory cell resides and if there has been no erasing and reprogramming after all erased cells have been processed, performing the steps of:

reading a particular reprogrammed cell at an elevated control gate voltage;

making a determination of whether the particular memory cell is still reprogrammed;

if the determination is that the particular memory cell is still reprogrammed, performing said step of reading at an elevated control voltage on another reprogrammed memory cell;

if the determination is that the particular memory cell has been disturbed, refreshing the particular memory cell; and performing said step of reading at an elevated control voltage on another reprogrammed memory cell.

16. The method of claim 15, and further comprising the steps of:

storing the state of each memory cell after determining the state of each cell; and storing the states of memory cells not yet determined after determining that a particular erased memory cell has been disturbed.

17. The method of claim 15, and further comprising the step of storing the states of all memory cells.

18. The method of claim 15, and further comprising the step of storing the states of all memory cells after determining that a particular erased memory cell has been disturbed.

19. The method of claim 15, wherein said step of determining whether a particular memory cell has been programmed or erased comprises reading the particular cell at a control gate voltage that is high enough to ensure conduction through disturbed erased cells and low enough to ensure no conduction through disturbed programmed cells.

20. The method of claim 15, wherein said step of making a determination of whether the particular cell is still programmed comprises determining whether the particular memory cell conducts at the elevated control gate voltage, conduction indicating that the particular memory cell has been disturbed.

21. The method of claim 20, wherein said step of making a determination of whether the particular cell is still erased comprises determining whether the particular memory cell conducts at the lowered control gate voltage, conduction indicating that the particular memory cell has not been disturbed.

22. The method of claim 15, wherein said step of making a determination of whether the particular cell is still erased comprises determining whether the particular memory cell conducts at the lowered control gate voltage, conduction indicating that the particular memory cell has not been disturbed.

23. The method of claim 15, wherein said step of refreshing comprises pulsing the particular memory cell with a restoration pulse.

24. The method of claim 23, wherein the restoration pulse has a smaller pulse width than the width of a programing pulse.

25. The method of claim 15, further comprising the steps of:

counting the number of erase cycles performed in sectors electrically associated with a particular sector; and performing said method on cells within the particular sector in response to said step of counting reaching a predetermined number.

26. A method of refreshing a flash electrically erasable, programmable read only memory having a plurality of memory cells grouped in sectors of said cells, comprising the steps of:

determining whether a particular memory cell has been programmed or erased;

if the state of a particular memory cell is programmed, performing the steps of:

reading the particular memory cell at an elevated control gate voltage;

making a determination of whether the particular memory cell is still programmed;

if the determination is that the particular memory cell is still programmed, performing said method on another memory cell;

if the determination is that the particular memory cell has been disturbed, refreshing the particular memory cell; and performing said method on another memory cell; and if the state of the particular memory cell is erased, performing the steps of:

reading the particular programmed cell at a lowered control gate voltage;

making a determination of whether the particular memory cell is still erased;

if the determination is that the particular memory cell is still erased, performing said step on another memory cell;

if the determination is that the particular memory cell has been disturbed, erasing the sector in which the memory cell resides; and reprogramming said sector in which the particular memory cell resides.

27. The method of claim 26, and further comprising the steps of:

storing the state of each memory cell after determining the state of each cell; and storing the states of memory cells not yet determined after determining that a particular erased memory cell has been disturbed.

28. The method of claim 26, and further comprising the step of storing the states of all memory cells.

29. The method of claim 26, and further comprising the step of storing the states of all memory cells after determining that a particular erased memory cell has been disturbed.

30. The method of claim 26, wherein said step of determining whether a particular memory cell has been programmed or erased comprises reading the particular cell at a control gate voltage that is high enough to ensure conduction through disturbed erased cells and low enough to ensure no conduction through disturbed programmed cells.

31. The method of claim 26, wherein said step of making a determination of whether the particular cell is still programmed comprises determining whether the particular memory cell conducts at the elevated control gate voltage, conduction indicating that the particular memory cell has been disturbed.

32. The method of claim 31, wherein said step of making a determination of whether the particular cell is still erased comprises determining whether the particular memory cell conducts at the lowered control gate voltage, conduction indicating that the particular memory cell has not been disturbed.

33. The method of claim 26, wherein said step of making a determination of whether the particular cell is still erased comprises determining whether the particular memory cell conducts at the lowered control gate voltage, conduction indicating that the particular memory cell has not been disturbed.

34. The method of claim 26, wherein said step of refreshing comprises pulsing the particular memory cell with a restoration pulse.

35. The method of claim 34, wherein the restoration pulse has a smaller pulse width than the width of a programing pulse.

36. The method of claim 26 further comprising the steps of:

counting the number of erase cycles performed in sectors electrically associated with a particular sector; and performing said method on cells within the particular sector in response to said step of counting reaching a predetermined number.

37. A flash electrically erasable, programmable read only memory having a plurality of memory cells, comprising:

a plurality of sectors, each of said sectors including a plurality of memory cells, each of said memory cells including a control gate, and said memory cells operable to conduct if erased and not conduct if programmed;

a row decoder coupled to said sectors, said row decoder operable to generate an elevated and a lowered control gate voltage;

a column decoder coupled to said sectors;

a read/write/erase circuit coupled to said row decoder and said column decoder, said row decoder, said column decoder, and said read/write/erase circuit for reading, programming, and erasing particular memory cells within said sectors;

circuitry for causing said memory cells to be read at said elevated control gate voltage;

circuitry for causing those memory cells which conduct at said elevated control gate voltage to be read at said lowered control gate voltage; and circuitry for refreshing those memory cells which do not conduct at said lowered control gate voltage.

38. The circuit of claim 37, wherein said circuitry for refreshing is operable to cause programming through restoration pulses.

39. The circuit of claim 38, wherein said restoration pulses are of smaller pulse width than the width of a programming pulse.

40. The circuit of claim 37, and further comprising counting circuitry for counting the number of erase cycles performed in sectors electrically associated with a particular sector, such that said circuitry for causing reading at said elevated and lowered control gate voltages, and said circuitry for refreshing are enabled in response to said counting circuitry counting to a predetermined number.

41. A flash electrically erasable, programmable read only memory having a plurality of memory cells, comprising:

a memory for storing the state of said memory cells;

a plurality of sectors, each of said sectors including a plurality of memory cells, each of said memory cells including a control gate, and said memory cells operable to conduct if erased and not conduct if programmed;

a row decoder coupled to said sectors, said row decoder operable to generate an elevated control gate voltage, a lowered control gate voltage, and a determination control gate voltage;

a column decoder coupled to said sectors;

a read/write/erase circuit coupled to said row decoder and said column decoder, said row decoder, said column decoder, and said read/write/erase circuit for reading, programming, and erasing particular memory cells within said sectors;

circuitry for storing the state of particular memory cells after being read at said determination control gate voltage;

circuitry for accessing said random access memory and reading the state of each memory cell;

circuitry for causing those memory cells which have been programmed to be read at said elevated control gate voltage;

circuitry for refreshing those memory cells which have been programmed and which conduct at said elevated control gate voltage;

circuitry for causing those memory cells which have been erased to be read at said lowered control gate voltage;

circuitry for causing erasure of the sectors in which memory cells reside which have been erased and which do not conduct at said lowered control gate voltage; and circuitry for causing reprogramming of the erased sectors.

42. The circuit of claim 41, wherein said circuitry for refreshing is operable to cause programing through restoration pulses.

43. The circuit of claim 42, wherein said restoration pulses are of smaller pulse width than the width of a programming pulse.

44. The circuit of claim 41, and further comprising counting circuitry for counting the number of erase cycles performed in sectors electrically associated with a particular sector, such that said circuitry for causing reading at said elevated and lowered control gate voltages, and said circuitry for refreshing are enabled in response to said counting circuitry counting to a predetermined number.

45. The circuit of claim 41, wherein said memory is on-chip with said memory cells.

46. The circuit of claim 41, wherein said memory is off-chip from said memory cells.

* * * * *